US011671685B2

(12) United States Patent
Yamamoto

(10) Patent No.: US 11,671,685 B2
(45) Date of Patent: Jun. 6, 2023

(54) IMAGE CAPTURING APPARATUS

(71) Applicant: CANON KABUSHIKI KAISHA, Tokyo (JP)

(72) Inventor: Takeshi Yamamoto, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/675,991

(22) Filed: Feb. 18, 2022

(65) Prior Publication Data
US 2022/0263991 A1   Aug. 18, 2022

(30) Foreign Application Priority Data

Feb. 18, 2021 (JP) .............................. JP2021-024138

(51) Int. Cl.
*H04N 23/52* (2023.01)
*H04N 23/695* (2023.01)
(Continued)

(52) U.S. Cl.
CPC ......... *H04N 5/22521* (2018.08); *G03B 17/55* (2013.01); *G03B 17/561* (2013.01); *G08B 13/1963* (2013.01); *G08B 13/19619* (2013.01); *G08B 13/19621* (2013.01); *H04N 7/18* (2013.01); *H04N 23/54* (2023.01);
(Continued)

(58) Field of Classification Search
CPC .... G03B 17/02; G03B 17/55; G03B 2217/00; G03B 2217/002; G08B 13/19617; G08B 13/19619; G08B 13/19621; G08B 13/1963; G08B 13/19632; H04N 5/2251; H04N 5/2252; H04N 5/22521; H04N 5/2253; H04N 5/2257; H04N 5/2259; H04N 5/23299; H04N 7/18; H04N 23/50; H04N 23/51; H04N 23/52; H04N 23/54; H04N 23/57; H04N 23/58; H04N 23/695; H05K 7/20145; H05K 7/20154; H05K 7/20163;
(Continued)

(56) References Cited

U.S. PATENT DOCUMENTS 10,842,042 B2 * 11/2020 Kim .................... H05K 7/20172
2005/0206779 A1 * 9/2005 Aoki .................... F16M 13/027
348/E5.025
(Continued)

FOREIGN PATENT DOCUMENTS

CN    213028209 U    4/2021
JP    3906844 B2    4/2007
(Continued)

*Primary Examiner* — Twyler L Haskins
*Assistant Examiner* — Akshay Trehan
(74) *Attorney, Agent, or Firm* — Canon U.S.A., Inc. IP Division

(57) ABSTRACT

An image capturing apparatus includes a camera unit, a pair of supporting members, a fixation member, a drive member, a heat generating member, a first cover member, and a second cover member. The second cover member has a first opening into which air from outside flows and a second opening from which air inside the second cover member flows to outside, The fixation member has a third opening into which air that has flowed out of the second opening flows, and a fourth opening from which air inside the fixation member flows to outside. The heat generating member is disposed in a flow channel of air flowing from the first opening to the second opening.

9 Claims, 8 Drawing Sheets

(51) Int. Cl.
    *G03B 17/55*     (2021.01)
    *H05K 7/20*     (2006.01)
    *H04N 7/18*     (2006.01)
    *G08B 13/196*     (2006.01)
    *H04N 23/54*     (2023.01)
    *H04N 23/58*     (2023.01)
    *H04N 23/57*     (2023.01)
    *G03B 17/56*     (2021.01)
    *H04N 5/225*     (2006.01)

(52) U.S. Cl.
    CPC ........... *H04N 23/58* (2023.01); *H04N 23/695* (2023.01); *H05K 7/20145* (2013.01); *H05K 7/20154* (2013.01); *H05K 7/20163* (2013.01); *H04M 2250/20* (2013.01); *H04N 23/57* (2023.01)

(58) Field of Classification Search
    CPC .............. G06F 1/1686; H04M 1/0264; H04M 2250/20; H04M 2250/52
    See application file for complete search history.

(56) References Cited

U.S. PATENT DOCUMENTS

2007/0024743 A1*   2/2007   Hida ................ G08B 13/19619
                                                                      348/E5.026
2014/0063334 A1*   3/2014   McBride ............. H04N 5/2252
                                                                        348/373

FOREIGN PATENT DOCUMENTS

| JP | 2012039193 A | * | 2/2012 | ............. H04N 5/225 |
| JP | 2013085204 A | * | 5/2013 | ............. G03B 15/00 |
| JP | 2013085204 A | | 5/2013 | |

* cited by examiner

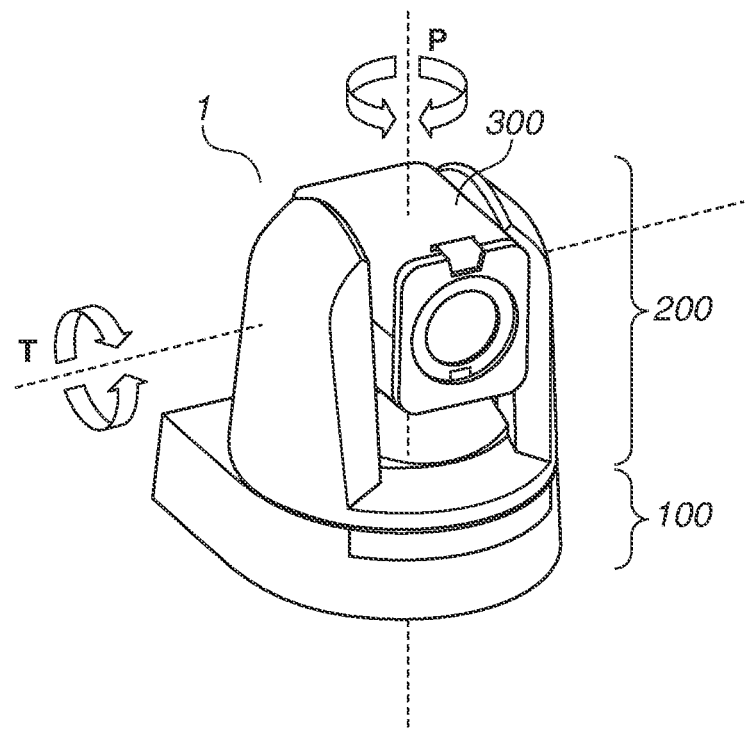
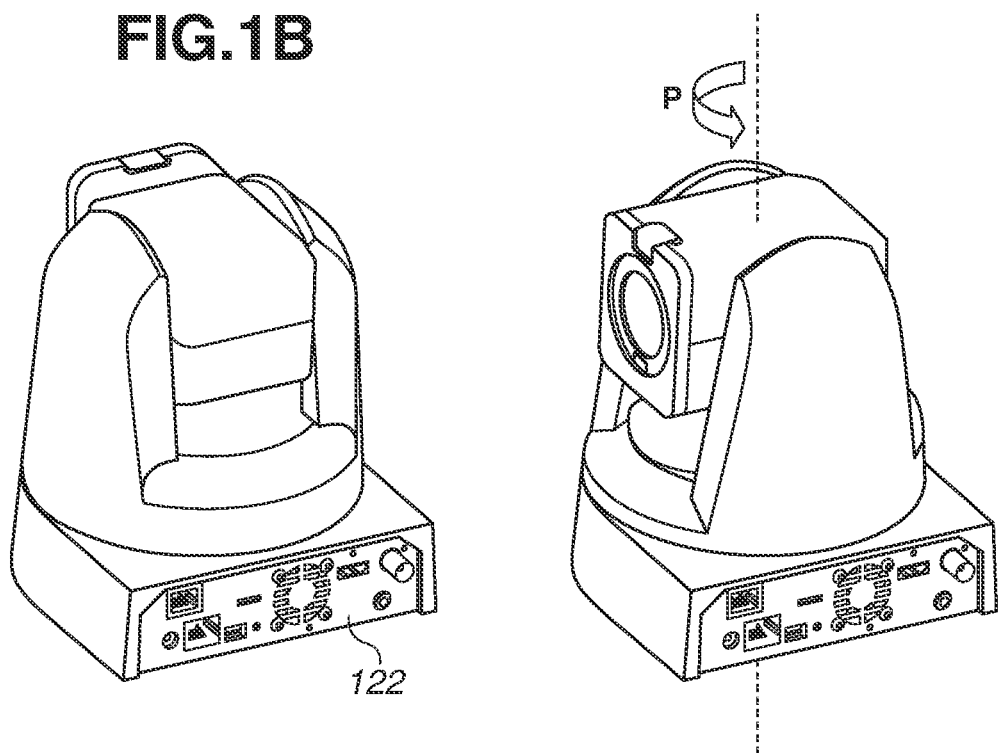

IMAGE CAPTURING APPARATUS

BACKGROUND

Field of the Invention

The present disclosure relates to a cooling structure of an image capturing apparatus.

Description of the Related Art

In recent years, higher functionality and higher performance of image capturing apparatuses have been demanded, with more power consumption and heating values of the apparatuses. Operation of the apparatus under high temperature environment can cause malfunction or performance degradation of components mounted in the apparatus, leading to a failure of the apparatus. Thus, recent image capturing apparatuses are demanded to have higher heat releasing performance.

An image capturing apparatus with a pan-tilt mechanism discussed in Japanese Patent Application Laid-Open No. 2013-85204 has a configuration that allows air to be circulated across the image capturing apparatus to improve internal temperature environment. In addition, Japanese Patent No. 3906844 discusses an image capturing apparatus provided with a tilt drive unit for rotating an image capturing unit in the tilt direction disposed in a supporting member for supporting the image capturing unit.

SUMMARY OF THE INVENTION

The present disclosure is directed to an image capturing apparatus providing a high heat releasing performance with a reduced presence of dust on the drive unit.

Accordingly, the present disclosure provides an image capturing apparatus comprising: a camera unit; a pair of supporting members configured to support the camera unit for rotation in a tilt direction about a tilt axis; a fixation member configured to support the pair of supporting members; a drive member disposed on one of the pair of supporting members and configured to rotationally drive the camera unit in the tilt direction; a heat generating member disposed on the other one of the pair of supporting members; a first cover member configured to cover the supporting member on which the drive member is disposed; and a second cover member configured to cover the supporting member on which the heat generating member is disposed, wherein the second cover member has a first opening into which air from outside flows and a second opening from which air inside the second cover member flows to outside, wherein the fixation member has a third opening into which air that has flowed out of the second opening flows, and a fourth opening from which air inside the fixation member flows to outside, and wherein the heat generating member is disposed in or in contact with a flow channel of air flowing from the first opening to the second opening.

Further features of the present disclosure will become apparent from the following description of embodiments with reference to the attached drawings.

BRIEF DESCRIPTION OF THE DRAWINGS

FIGS. 1A through 1C are diagrams each illustrating an image capturing apparatus according to a first embodiment.

DESCRIPTION OF THE EMBODIMENTS

Figure 2A:
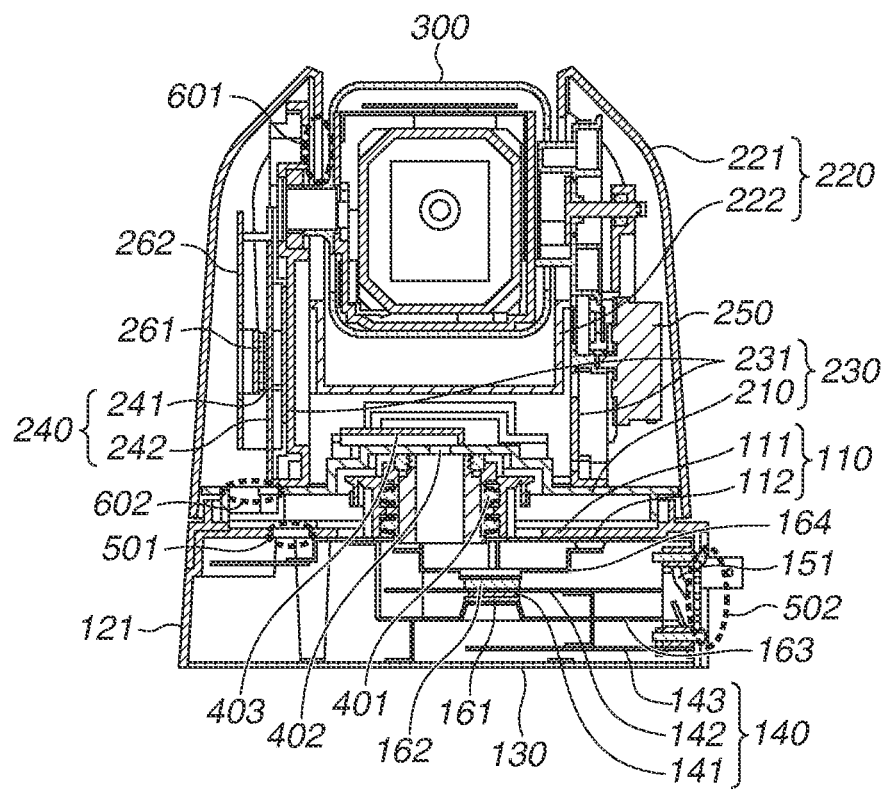
FIGS. 2A and 2B are sectional views each illustrating the image capturing apparatus according to the first embodiment.
Figure 2B:
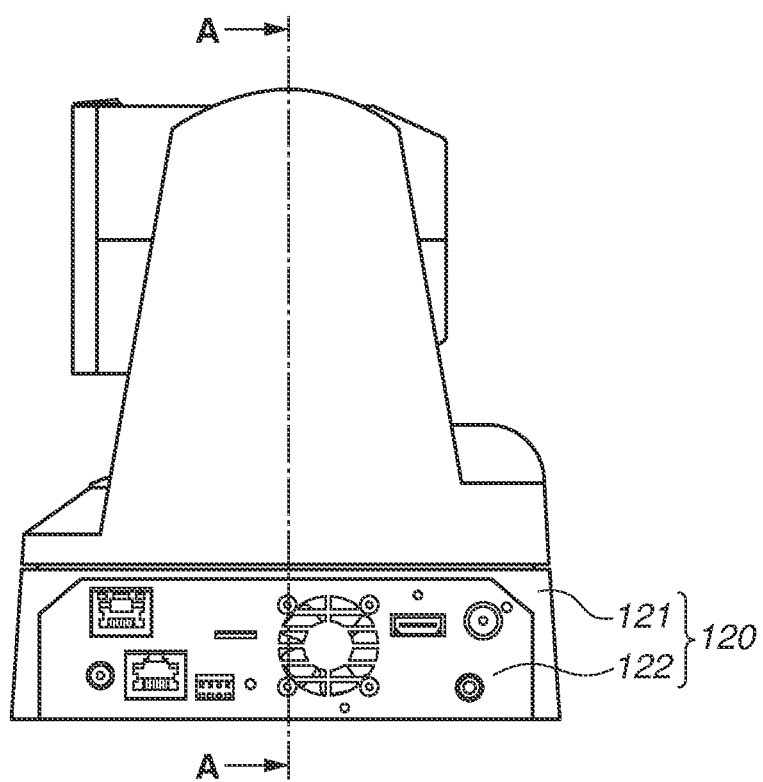

Hereinafter, some embodiments of the present disclosure will be described in detail with reference to the drawings. Descriptions of components that are not directly related to the present disclosure will be omitted, not illustrated in the drawings.

Figure 3:
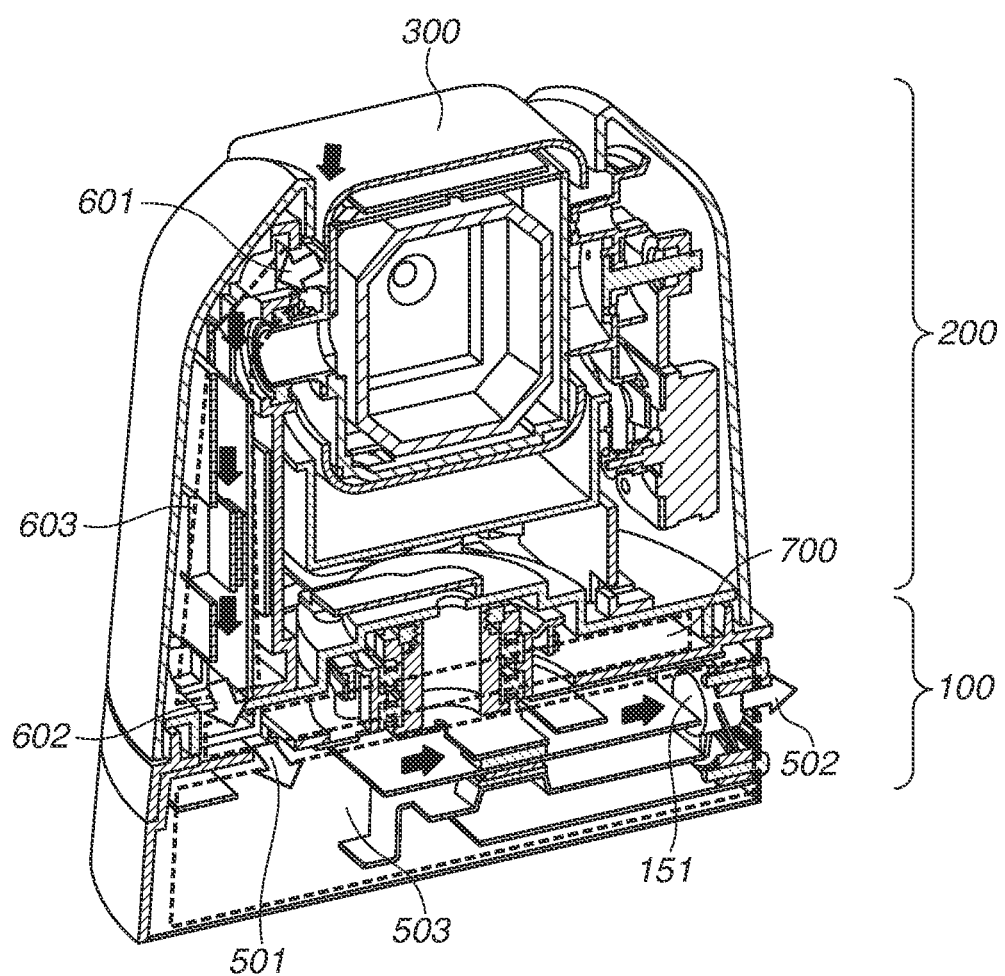
FIG. 3 is a perspective sectional view illustrating the image capturing apparatus according to the first embodiment.
Figure 4:
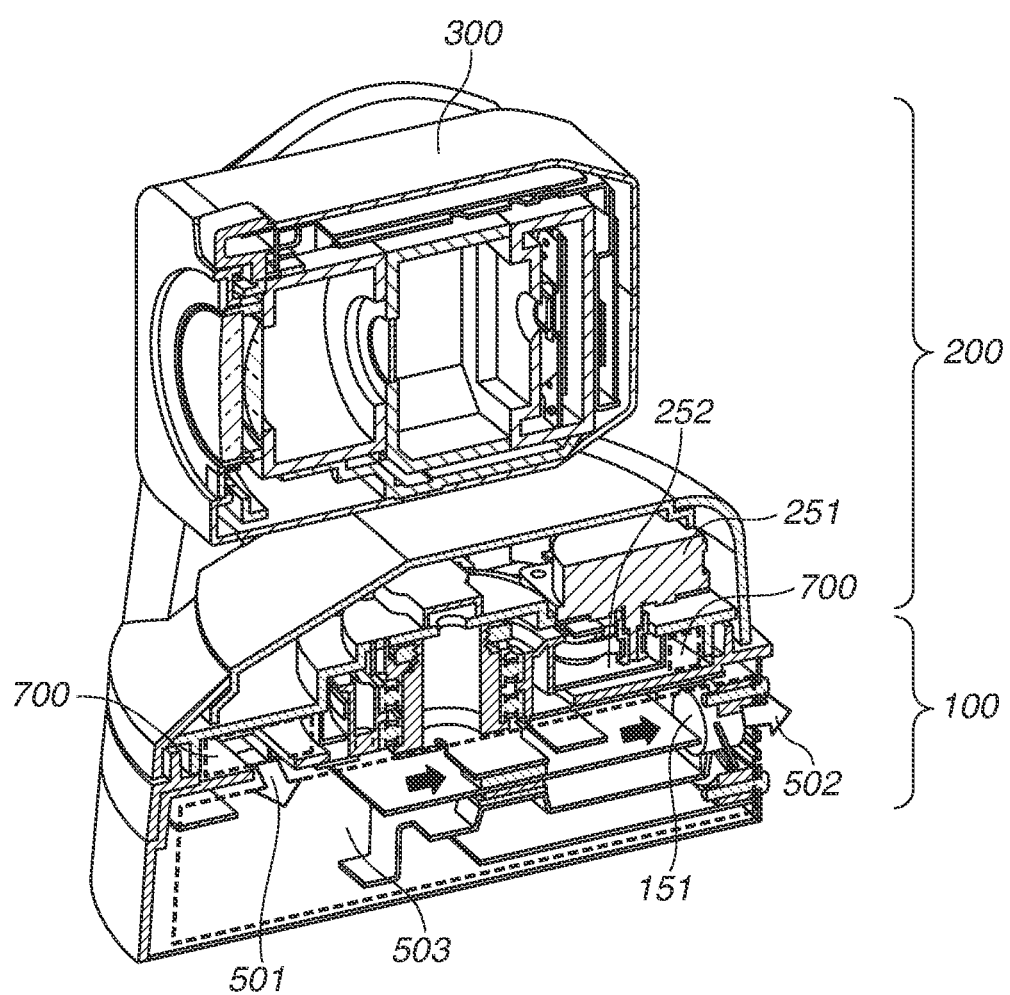
FIG. 4 is a perspective sectional view illustrating the image capturing apparatus according to the first embodiment.

FIGS. 1 through 4 each are a diagram of an image capturing apparatus 1 of the first embodiment. FIG. 1A is a perspective view of the front side of the image capturing apparatus 1, and FIG. 1B is a perspective view of the back side of the image capturing apparatus 1. FIG. 1C is a diagram illustrating the image capturing apparatus 1 pan-rotated by 90 degrees with respect to a base unit 100 by a pan moving unit 200 from it illustrated in FIG. 1A. FIG. 2A is a sectional view of the image capturing apparatus 1. FIG. 2B is a diagram of the image capturing apparatus 1 in view of the back side of the image capturing apparatus 1 illustrated in FIG. 1C. FIG. 2A is the sectional view along the dashed line A-A of FIG. 2B. Each of FIGS. 3 and 4 is a perspective sectional view of the image capturing apparatus 1.

As illustrated in FIG. 1A, the image capturing apparatus 1 of the present embodiment includes the base unit 100 as a fixation member, the pan moving unit 200, and a camera unit 300.

The base unit 100 is a portion to be placed on, for example, a floor or a desk. The base unit 100 includes electrical components. The pan moving unit 200 can pan-rotate about a P-axis with respect to the base unit 100. The pan moving unit 200 is rotatably fixed to the base unit 100 via a bearing 401. The camera unit 300 can tilt-rotate about a T-axis with respect to the pan moving unit 200. The camera unit 300 includes a lens group and image capturing elements. The camera unit 300 can pan-rotate and tilt-rotate, which allows capturing images in desired directions.

<Details of Base Unit 100>

The base unit 100 includes a base-unit bottom plate 130, a base-unit side cover 120, and a base-unit top plate 110. The base-unit bottom plate 130, the base-unit side cover 120, and the base-unit top plate 110 are respectively disposed on the bottom, one side surface, and the top of the base unit 100.

The base-unit side cover 120 on the side surface of the base unit 100 includes a base-unit back side metal plate 122 and a base-unit cover 121. The base-unit back side metal plate 122 and the base-unit cover 121 are respectively disposed on the back side and another side other than the back side of the base unit 100. The base-unit back side metal plate 122 is provided with a power source port and various cable ports, which allow power to be supplied and communication with external units.

The base-unit top plate 110 on the top of the base unit 100 includes an upper side metal plate 112 and an upper side cover 111. The combination of the upper side metal plate 112 and the upper side cover 111 enhances the strength of the base-unit top plate 110, supporting the pan moving unit 200 and the camera unit 300. The base-unit top plate 110 covers openings that communicate with the exterior. If an opening is not covered, air that flows inside the base unit 100 will leak to the outside. Such air leakage obstructs air circulation, degrading cooling performance.

A wiring path (not illustrated) is liable to cause air leak. For example, the bearing 401 has a hole in it, and wiring connects the base unit 100 to the pan moving unit 200 through a wiring path 402. Such a hole can be, for example, sealed with tape, or blocked by a wiring holder 403 that pinches inserted sponge and/or gaskets holding the wiring. Similarly, other wiring paths (not illustrated) can be covered by gap being blocked as appropriate, which will reduce air leakage.

Inside the base unit 100, a pan motor 251, a fan 151, a base-unit circuit board A 142, and a base-unit circuit board B 143 are included. The pan motor 251 rotates the camera unit 300 and the pan moving unit 200 in the pan directions.

The pan motor 251 is isolated by a fixed air channel 503 and a pan drive unit cover 252. Thus, dust falling on the pan motor 251 can be reduced. The fan 151 is an axial-flow fan. A base-unit electrical component 141 is mounted on the base-unit circuit board A 142. The base-unit electrical component 141 is, for example, a memory and an integrated circuit (IC) to be used in image processing. In recent years, a larger amount of calculation is carried out in image processing as the quality of captured images is higher, inviting higher heating values of the base-unit electrical component 141 and the base-unit circuit board A 142, entailing efficiently cooling such heat generating portions. Herein, the base-unit electrical component 141 and the base-unit circuit board A 142 are referred to as a first heat generating portion 140 (a fixed heat generating member).

In the image capturing apparatus 1 of the present embodiment, a base-unit heat releasing metal plate A 163 and a base-unit heat releasing metal plate B 164 are respectively disposed below and above the first heat generating portion 140. A base-unit heat conduction member A 161 connects the first heat generating portion 140 and the base-unit heat releasing metal plate A 163 to each other, and a base-unit heat conduction member B 162 connects the first heat generating portion 140 and the base-unit heat releasing metal plate B 164 to each other. That configuration allows heat generated by the first heat generating portion 140 to be conducted and diffused over a large area.

In addition, the base-unit heat releasing metal plate A 163 or the base-unit heat releasing metal plate B 164 warmed by the heat conduction is exposed to the air generated by the fan 151, which further enhances cooling efficiency. The air inside the base unit 100 by the fan 151 flows in a path from a base-unit opening A 501 (a third opening) through a base-unit opening B 502 (a fourth opening) and exhausted to the outside. An air channel in which the air flows the way is called the fixed air channel 503. An overall airflow will be described below with reference to FIG. 3.

<Details of Pan Moving Unit 200>

The pan moving unit 200 includes a moving-unit supporting plate 210, a pair of camera-unit supporting posts 231 as supporting members, and a moving-unit exterior cover 220 as a cover member. The pair of camera-unit supporting posts 231 is fixed to the moving-unit supporting plate 210 on both sides of the pan rotation axis, each being away from the pan rotation axis equally. The pair of camera-unit supporting posts 231 tilt-rotatably supports the camera unit 300 in the tilt directions.

A tilt motor 250 as a drive member is disposed on one of the pair of camera-unit supporting posts 231, and a moving-unit circuit board 242 and a moving-unit electrical component 241 are supported on the other one of the pair of camera-unit supporting posts 231. The tilt motor 250 tilt-drives the camera unit 300 via gears, a belt, or other components. As the image capturing apparatus 1 of the present embodiment includes separate exterior covers for the base unit 100 and the pan moving unit 200, the heat generated inside the base unit 100 does not tend to be transferred to the exterior cover for the pan moving unit 200. Thus, heat generating sources are arranged in the pan moving unit 200, as well as in the base unit 100, to dispersedly release heat from the external cover for the base unit 100 and the external cover for the pan moving unit 200. Such arrangement is effective as compared with a case in which all of the heat generating sources are arranged inside the base unit 100. In the image capturing apparatus 1 of the present embodiment, the moving-unit circuit board 242 and the moving-unit electrical component 241 are disposed in the pan moving unit 200 for the above-described reasons. Herein, the moving-unit circuit board 242 and the moving-unit electrical component 241 are referred to as a second heat generating portion 240 (a heat generating member).

The second heat generating portion 240 and the tilt motor 250 installed in the pan moving unit 200 are covered with the moving-unit exterior cover 220. The moving-unit exterior cover 220 of the present embodiment is divided into two portions that are a moving-unit outer side exterior cover 221 and a moving-unit inner side exterior cover 222. The moving-unit outer side exterior cover 221 covers the outer circumference of the pan moving unit 200, and the moving-unit inner side exterior cover 222 is disposed under the camera unit 300. However, the dividing position of the moving-unit exterior cover 220 is not limited thereto. The moving-unit exterior cover 220 may be divided into more portions.

The moving-unit exterior cover 220 covers the pair of camera-unit supporting posts 231 individually. The moving-unit exterior cover 220 has a partition structure 230, which blocks the flow of air between the second heat generating portion 240 and the tilt motor 250 attached to the respective supporting posts of the two camera-unit supporting posts 231. In the present embodiment, the partition structure 230 is formed of the camera-unit supporting posts 231 and the moving-unit supporting plate 210. Of the space formed of the moving-unit exterior cover 220 and the partition structure 230, the space that accommodates the second heat generating portion 240 is formed with the moving-unit exterior cover 220 (a second cover member). In addition, the moving-unit exterior cover 220 has a moving-unit opening A 601 (a first opening) in it, and the moving-unit supporting plate 210 has a moving-unit opening B 602 (a second opening) in it. The air flows between the moving-unit opening A 601 and the moving-unit opening B 602, forming a movable air channel 603. That is, the second heat generating portion 240 is disposed near (in) the flow channel of the air flowing out of the moving-unit opening A 601 to the moving-unit opening B 602.

In the space that accommodates the tilt motor 250, there is no opening like the space that accommodates the second heat generating portion 240. That is, in the space that accommodates the tilt motor 250, the moving-unit exterior cover 220 or the moving-unit supporting plate 210 has no opening in it. In other words, this configuration prevents air from flowing in from the outside such as the base unit 100 into the interior formed of the moving-unit exterior cover 220 and the moving-unit supporting plate 210 (a first cover member). This reduces dust on the tilt motor 250 due to air flowing in from the base unit 100.

In addition, the second heat generating portion 240 is connected to a moving-unit heat releasing metal plate 262 via a moving-unit heat conduction member 261. Thus, heat generated by the second heat generating portion 240 is conducted and spread over a large area. Moreover, the moving-unit heat releasing metal plate 262 is exposed to the air flowing in out of the moving-unit opening A 601, which cools the second heat generating portion 240 efficiently.

<Details of Air Circulation>

Next, an overall air flow in the present embodiment will be described with reference to FIG. 3. The fixed air channel 503, which connects the base-unit opening A 501 and the base-unit opening B 502, is formed inside the base unit 100. The fan 151 is disposed in the base-unit opening B 502. The air inside the fixed air channel 503 is exhausted from the base-unit opening B 502 to the outside. Moreover, that makes the air pressure in the fixed air channel 503 negative, which allows air to flow in out of the base-unit opening A 501. There is connection space 700 between the base unit 100 and the pan moving unit 200. Air flows out from the connection space 700 to the base-unit opening A 501, making the air pressure in the connection space 700 negative, allowing air to flow in out of the moving-unit opening B 602. The inflow of the air out of the moving-unit opening B 602 makes the air pressure inside the movable air channel 603 negative, allowing outside air to flow in out of the moving-unit opening A 601.

The first heat generating portion 140 including the base-unit electrical component 141 and the base-unit circuit board A 142, and the second heat generating portion 240 including the moving-unit circuit board 242 and the moving-unit electrical component 241 are cooled by the airflow as described above.

According to the present embodiment, the above-described configuration allows taking outside air into the image capturing apparatus 1 to cool down the heat generating portions efficiently and reduces dust on the tilt motor 250.

An image capturing apparatus 1 of a second embodiment will be described with reference to FIGS. 5 and 6.

Figure 5:
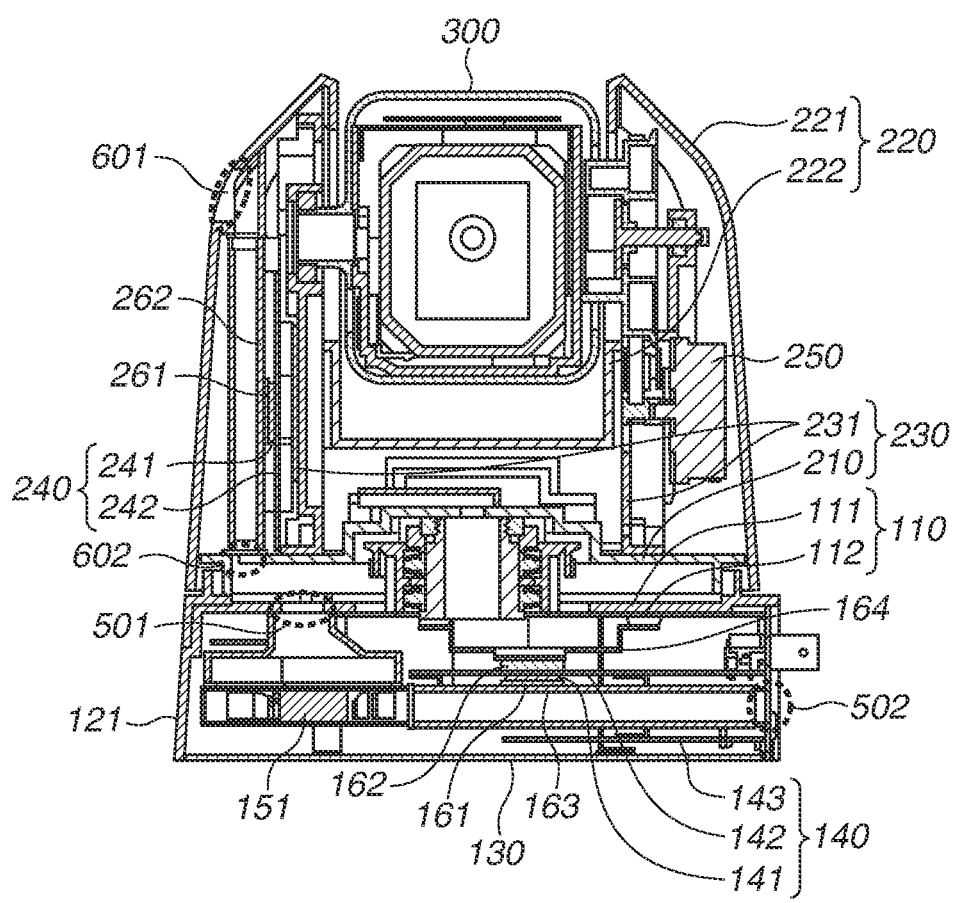
FIG. 5 is a sectional view illustrating an image capturing apparatus according to a second embodiment.
Figure 6:
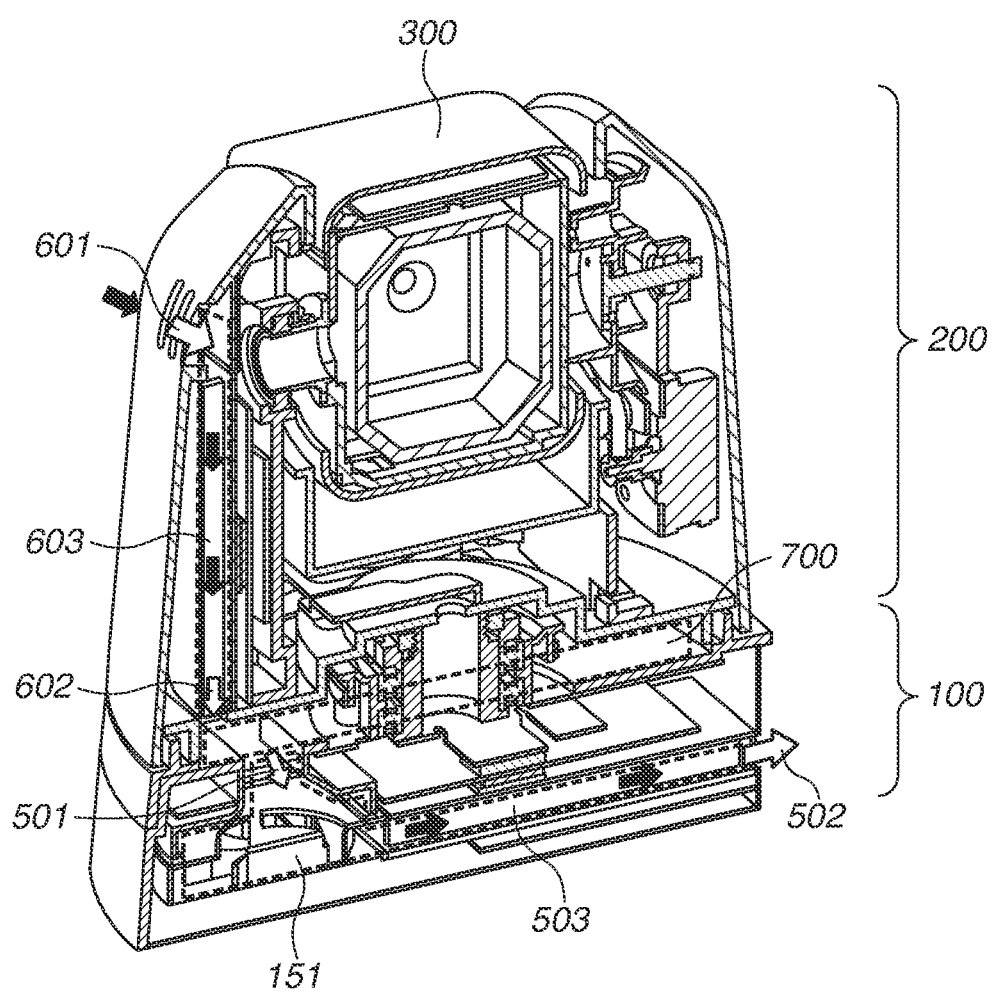
FIG. 6 is a perspective sectional view illustrating the image capturing apparatus according to the second embodiment.

FIG. 5 is a sectional view of an image capturing apparatus 1 of the second embodiment. FIG. 6 is a perspective sectional view of the image capturing apparatus 1 of the second embodiment.

In the first embodiment, the interior of the entire housing is used as an air channel to cool down the heat generating portions in the air channel. In the second embodiment, a duct-shaped air channel is provided inside a housing, and a first heat generating portion 140 and a second heat generating portion 240 are disposed in contact with the duct-shaped air channel from outside the duct-shaped air channel. Thus, the first heat generating portion 140 and the second heat generating portion 240 can be efficiently cooled while dust on the heat generating portions is reduced.

In the first embodiment, the fan 151 is an axial-flow fan and disposed in the front of the base-unit opening B 502. In the second embodiment, a centrifugal fan is used. The centrifugal fan is disposed inside a base-unit opening A 501.

Moreover, in the first embodiment, the moving-unit opening A 601 is formed between the camera unit 300 and the pan moving unit 200. In the second embodiment, a moving-unit opening A 601 is formed in a moving-unit outer side exterior cover 221 of a pan moving unit 200.

According to the second embodiment, the image capturing apparatus 1 includes a duct to allow air to flow from the base-unit opening A 501 to a base-unit opening B 502, and the first heat generating portion 140 is disposed in contact with the duct from outside the duct. Similarly, in the second embodiment, the image capturing apparatus 1 includes a duct to allow air to flow from the moving-unit opening A 601 to a moving-unit opening B 602, and the second heat generating portion 240 is disposed in contact with the duct from outside the duct.

According to the present embodiment, the above-described configuration allows taking outside air into the image capturing apparatus 1 to cool down the heat generating portions efficiently and reduces dust on a tilt motor 250.

Figure 7:
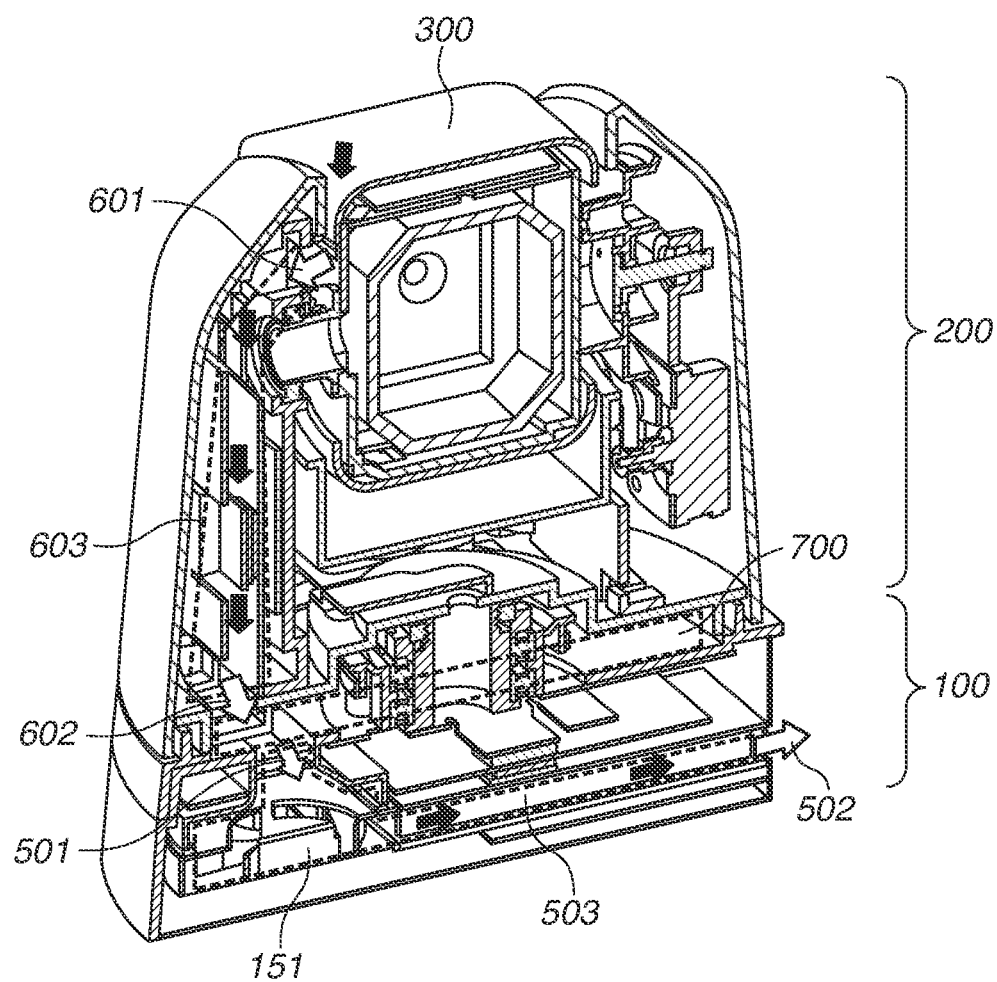
FIG. 7 is a perspective sectional view illustrating an image capturing apparatus according to a third embodiment.

Hereinafter, an image capturing apparatus 1 of a third embodiment will be described with reference to FIG. 7. FIG. 7 is a perspective sectional view of an image capturing apparatus 1 of the third embodiment. A pan moving unit 200 of the third embodiment has the same configuration as the pan moving unit 200 of the first embodiment, and a base unit 100 of the third embodiment has the same configuration as the base unit 100 of the second embodiment.

That is, a moving-unit opening A 601 is formed between a camera unit 300 and the pan moving unit 200. A centrifugal fan is used as a fan 151. The centrifugal fan is disposed inside a base-unit opening A 501.

According to the present embodiment, the configuration allows taking outside air into the image capturing apparatus 1 to cool down the heat generating portions efficiently and reduces dust on a tilt motor 250.

Figure 8:
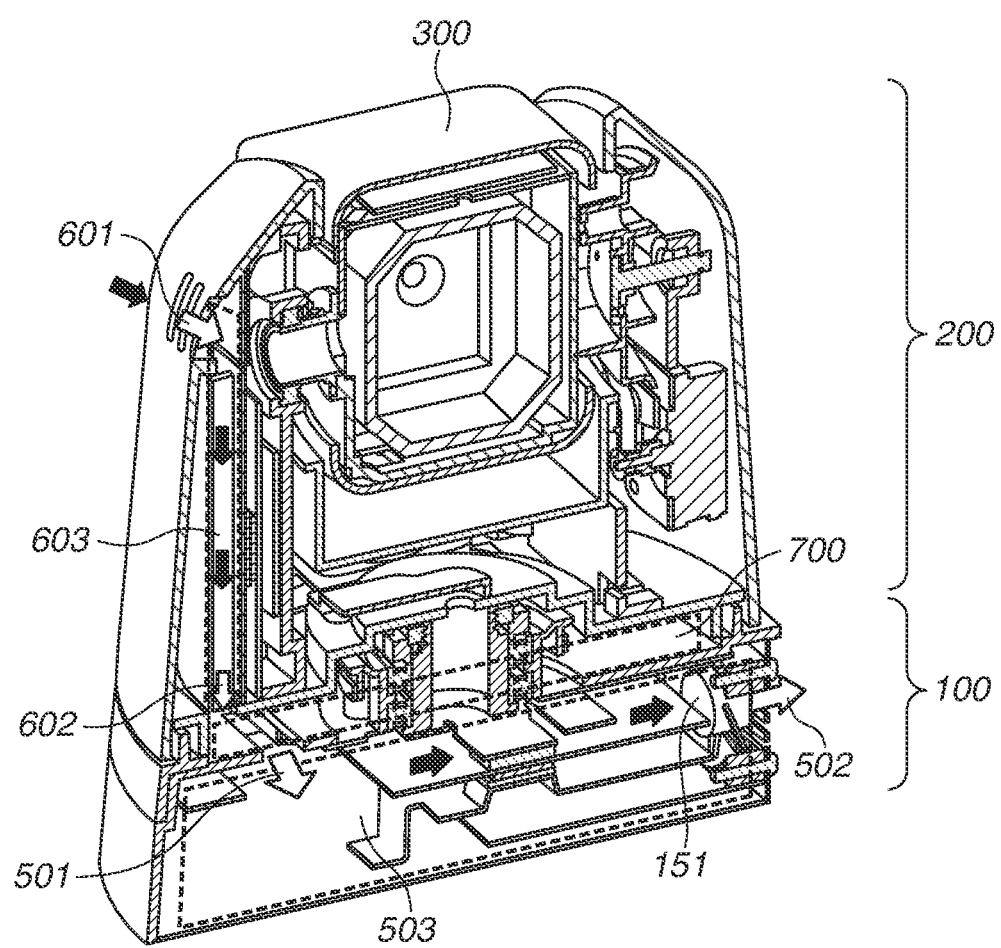
FIG. 8 is a perspective sectional view illustrating an image capturing apparatus according to a fourth embodiment.

Hereinafter, an image capturing apparatus 1 of a fourth embodiment will be described with reference to FIG. 8. FIG. 8 is a perspective sectional view of the image capturing apparatus 1 of the fourth embodiment.

A pan moving unit 200 of the fourth embodiment has the same configuration as the pan moving unit 200 of the second embodiment, and a base unit 100 of the fourth embodiment has the same configuration as the base unit 100 of the first embodiment. A moving-unit opening A 601 is formed in a moving-unit outer side exterior cover 221 of the pan moving unit 200.

A fan 151 is an axial fan and disposed in the front of a base-unit opening B 502.

According to the present embodiment, the configuration allows taking outside air into the image capturing apparatus 1 to cool down the heat generating portions efficiently and reduces dust on a tilt motor 250.

The present disclosure has been described with reference to the some embodiments, but is not limited thereto. Various modifications are possible within the scope of the present disclosure.

While the present disclosure has been described with reference to embodiments, it is to be understood that the disclosure is not limited to the disclosed embodiments but is defined by the scope of the following claims.

This application claims the benefit of Japanese Patent Application No. 2021-024138, filed Feb. 18, 2021, which is hereby incorporated by reference herein in its entirety.

The invention claimed is:

1. An image capturing apparatus comprising:
a camera unit;

a pair of supporting posts configured to support the camera unit for rotation in a tilt direction about a tilt axis:

a base configured to support the pair of supporting posts;

a drive motor disposed on one of the pair of supporting posts and configured to rotationally drive the camera unit in the tilt direction;

a heat generating member disposed on the other one of the pair of supporting posts;

a first cover configured to cover the supporting post on which the drive motor is disposed; and a second cover configured to cover the supporting post on which the heat generating member is disposed, wherein the second cover has a first opening into which air from outside flows and a second opening from which air inside the second cover flows to outside, wherein the base has a third opening into which air that has flowed out of the second opening flows, and a fourth opening from which air inside the base flows to outside, and wherein the heat generating member is disposed in or in contact with a flow channel of air flowing from the first opening to the second opening.

2. The image capturing apparatus according to claim 1, wherein the heat generating member is disposed in the flow channel of air flowing from the first opening to the second opening.

3. The image capturing apparatus according to claim 1, further comprising a duct configured to allow air to flow from the first opening to the second opening, wherein the heat generating member is disposed in contact with the duct from outside the duct.

4. The image capturing apparatus according to claim 1, further comprising a fixed heat generating member disposed inside the base, wherein the fixed heat generating member is disposed in or in contact with a flow channel of air flowing from the third opening to the fourth opening.

5. The image capturing apparatus according to claim 4, further comprising:

a duct configured to allow air to flow from the third opening to the fourth opening, wherein the fixed heat generating member is disposed in contact with the duct from outside the duct.

6. The image capturing apparatus according to claim 1, wherein the first cover has an interior that prevents air inside the base from flowing into the interior.

7. The image capturing apparatus according to claim 1, wherein the base has an interior in which a fan is disposed.

8. The image capturing apparatus according to claim 1, wherein the heat generating member is an electrical component or a circuit board.

9. The image capturing apparatus according to claim 1, wherein the base supports the supporting post for rotation in a pan direction about a pan axis.

* * * * *